United States Patent [19]

Schumacher

[11] Patent Number: 5,034,703
[45] Date of Patent: Jul. 23, 1991

[54] FREQUENCY SYNTHESIZER

[75] Inventor: Friedrich Schumacher, Munich, Fed. Rep. of Germany

[73] Assignee: Siemens Aktiengesellschaft, Munich, Fed. Rep. of Germany

[21] Appl. No.: 551,207

[22] Filed: Jul. 11, 1990

[30] Foreign Application Priority Data

Jul. 20, 1989 [DE] Fed. Rep. of Germany ....... 3924023

[51] Int. Cl.$^5$ .............................................. H03L 7/00
[52] U.S. Cl. ......................................... 331/2; 331/25
[58] Field of Search ................... 331/2, 18, 25, 46, 50; 307/529

[56] References Cited

U.S. PATENT DOCUMENTS 4,516,084 5/1985 Crowley ........................... 331/25 X
4,682,122 7/1987 Remy et al. ...................... 331/25 X
4,912,432 3/1990 Galani et al. ........................... 331/2

OTHER PUBLICATIONS

"Frequency Synthesizers Theory and Design", by V. Manassewitsch, John Wiley & Sons, 2nd Ed.; 1980, pp. 1-50.
"Synthesizer Primer: Defining the Elements of Good Design", by D. Brewerton & N. Urbaneta, periodical Microwaves & RF, Jun. 1984, pp. 79-86 & 124-125.

Primary Examiner—Robert J. Pascal
Attorney, Agent, or Firm—Hill, Van Santen, Steadman & Simpson

[57] ABSTRACT

Frequency synthesizer for use in the microwave range and that operates according to the indirect principle contains a reference frequency branch in which the reference frequency is derived from a crystal-stable fundamental frequency on the basis of multiple frequency multiplication and intermediate filtering one or more PLL segments cascaded according to the divide and mix principle, each of these PLL segments having an offset mixing stage for mixing the reference frequency with an offset frequency, an intermediate frequency mixing stage for mixing the filtered-out aggregate or difference frequency with the frequency of a pretunable, voltage-controlled oscillator into the intermediate frequency level, and a screen mixing stage for mixing the intermediate frequency with a comb line frequency corresponding to a multiple of the fundamental frequency for the purpose of generating an error signal for a phase frequency detector whose reference is a suitably divided fundamental frequency and whose output signal, after comparison, forms the control voltage for a voltage-controlled oscillator. The frequency synthesizer is suitable for a low-noise carrier supply that is capable of extremely fast frequency changes, this enabling its use in, for example, frequency-agile radar equipment.

19 Claims, 2 Drawing Sheets

FREQUENCY SYNTHESIZER

BACKGROUND OF THE INVENTION

The present invention is directed to a frequency synthesizer for generating different frequencies in a microwave range, having a reference frequency branch and at least one phase-controlled control circuit that forms a phase locked loop (PLL) segment and, that for more than one phase-controlled control circuit, are cascaded according to a frequency divide and mix principle, and having an offset mixing stage for mixing a stable offset frequency with a reference frequency derived in the reference frequency branch from a stable crystal oscillator fundamental frequency, having a phase frequency detector for comparing an error signal to a frequency which is likewise derived from the stable fundamental frequency, and having a voltage-controlled oscillator to which an output voltage of the phase frequency detector is supplied via a loop low-pass filter as a control voltage and from which an output frequency as well as, potentially after being conducted through a frequency divider, an offset frequency for the phase-controlled control circuit of a following PLL segment are derived.

Frequency generators that can switch very quickly between different frequency channels and thereby supply extremely lownoise signals are required in many radio transmission systems, and particularly in radar equipment.

Synthesizers that work either direct or indirect, that is, with phase-locked loops, are employed for this purpose. The fundamentals and embodiments of such synthesizers are extensively described in the book by V. Manassewitsch, "Frequency Synthesizers Theory and Design", Second Edition, 1980, John Wiley & Sons, particularly pages 1–50. When prior art direct synthesizers, wherein, the output frequency is directly composed of various fundamental frequencies, that is, by mixing and multiplying, are employed for the above purpose, then the secondary lines and the noise far from the carrier are unsatisfactory. The article by D. Brewerton N. Urbaneta: "Synthesizer primer: Defining the elements of good design", in the periodical "Microwaves & RF", June 1984, Pages 79–86 and pages 124 and 125, makes proposals in conjunction with indirect synthesizers as to how quickly switching, phase-controlled control loops (high speed multi-loops) can be realized with good performance features. As may be derived from this latter reference, the phase noise of a phase-locked loop is dependent on the division ratio within the locked loop. The phase noise assumes a minimum value for a division ratio of one. When the center frequency error signal is produced by mixing, then care must be exercised so that the multiplication factors in the reference branch remain as low as possible since the noise is increased by $N^2$ for every multiplication by the factor N. This proceeds particularly from the reference by V. Manassewitsch, particularly pages 119 through 124.

SUMMARY OF THE INVENTION

Upon employment of the principle of the indirect synthesizer and the advantages deriving as a result thereof with respect to the secondary lines and the noise behavior, the object of the present invention is to provide a frequency synthesizer that nearly achieves a frequency change switching speed of direct synthesizers.

This object is inventively achieved by a frequency synthesizer comprising: following a crystal oscillator that generates the stable fundamental frequency, the reference frequency branch having, in series, a first frequency multiplier, a crystal filter, at least one series-connected further frequency multiplier and a narrow-band band-pass filter dimensioned for the reference frequency; an input of a band-pass filter either for the aggregate or difference frequency connected to an output of the offset mixing stage, the output of the band-pass filter being connected to one of two inputs of an intermediate frequency stage whose other input is supplied with the output frequency of the voltage-controlled oscillator; an output of an intermediate frequency mixing stage, upon interposition of an intermediate frequency filter, is directly connected to an input of a screen mixing stage that represents the intermediate frequency input or is connected via a frequency multiplier to said input of the screen mixing stage at whose other input a signal is present that is filtered out of a comb line spectrum having a spectral line spacing corresponding to the fundamental frequency that is derived from the crystal oscillator or that is from a separate crystal oscillator via a comb line generator; the error signal oscillating a synchronous frequency level with the combination frequency of the signals supplied to the screen mixing stage supplied from the output of the screen mixing stage to a first input of the phase frequency detector and a reference signal derived from the crystal oscillator via a frequency divider and thus having a rigid division ratio with respect to the fundamental frequency or, respectively, the screen oscillator frequency supplied to a second input of said phase frequency detector for comparison; and the voltage-controlled oscillator to which the output voltage of the phase frequency detector, deriving as a result of the comparison supplied as the control voltage via the loop low-pass filter, being pretunable such that those frequencies of the comb line frequencies which the screen mixing stage respectively engages can be preset.

The advantages of the frequency synthesizer of the present invention are that no frequency dividers are used in the control loop and the multiplication factors in the reference branch remain low. This leads to extremely good noise properties. Moreover, the frequency synthesizer of the present invention, despite small frequency increments, allows the use of high reference frequency and correspondingly high control loop bandwidth. Extremely short switching times (<10 $\mu$sec) thereby become possible. The further, significant property of the frequency synthesizer of the present invention deriving from the nature of the frequency editing is comprised therein, except for the reference frequency that can be easily filtered out, no disturbing secondary lines appear despite high control loop bandwidths. The frequency synthesizers of the present invention thus meet in an optimum way all demands made of a synthesizer.

The frequency synthesizer constructed in conformity with the present invention is thus suitable for a low-noise carrier supply that is capable of extremely fast frequency changes, this particularly enabling an employment in frequency-agile radar equipment.

In further developments of the present invention the offset frequency can be generated by a direct digital synthesizer instead of being generated by way of derivation via a PLL segment and, when the frequency synthesizer has a plurality of PLL segments, all PLL segments are identically constructed. Also, the division ratio of the frequency dividers amounts to 1:10 for the phase-controlled control circuits cascaded in conformity with the frequency divide and mix principle, so that a decadic frequency synthesizer derives in which each PLL segment realizes one decimal place.

The loop low-pass filter can be preceded by a control-gain amplifier whose gain is pretunable. The intermediate frequency signal, when it coincides with the error signal in terms of frequency, is directly conducted to the first input of the phase frequency detector, that is without being introduced to the intermediate frequency input of the screen mixing stage. The output signal of the voltage-controlled oscillator can be respectively connected to one or more frequency multipliers that are arranged parallel to one another, so that carrier frequencies in higher frequency bands can be generated. The first frequency multiplier in the reference frequency branch can be a frequency doubler. Two further frequency multipliers each of which is a frequency tripler can be provided in the reference frequency branch following the crystal filter. A high-frequency amplifier can also be connected as an isolating amplifier in the path of the supply of the output signal of the voltage-controlled oscillator to the intermediate frequency mixing stage.

Furthermore, in the present invention the voltage-controlled oscillator is a circuit comprising a series connection of a monolithically integrated high-frequency amplifier, a first capacitor, a coaxial resonator having an inner conductor that is coupled via an inductive in-coupling loop and is fashioned mechanically tunable, and a second capacitor coupled to the inner conductor via an out-coupling loop in the co-coupling branch of said circuit that forms a resonant circuit and connects from the output thereof to the input thereof; for electronic pretuning, a plurality of trimmer capacitors respectively engageable and disengageable via a respective PIN diode connected at an outside to the inner conductor at suitable positions; another trimmer capacitor also having its one end connected at the outside to the inner conductor, a first varactor diode controlled by a pretuning voltage connected to the other end of said trimmer capacitor; and a second varactor diode that is charged by the control voltage also connected at the outside to the inner conductor via an inductor inductance.

Mechanical tuning of the coaxial resonator ensues with a tuning screw that is secured to a housing forming the outer conductor of the coaxial resonator and with which screw a plunger-type capacitor integrated with the inner conductor is set with respect to its capacitance.

The loop low-pass filter, as a feedthrough filter, is part of the voltage-controlled oscillator and the inner conductor forming the plunger-type capacitor together with the tuning screw can be temperature-compensating, for example, by being executed of invar.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
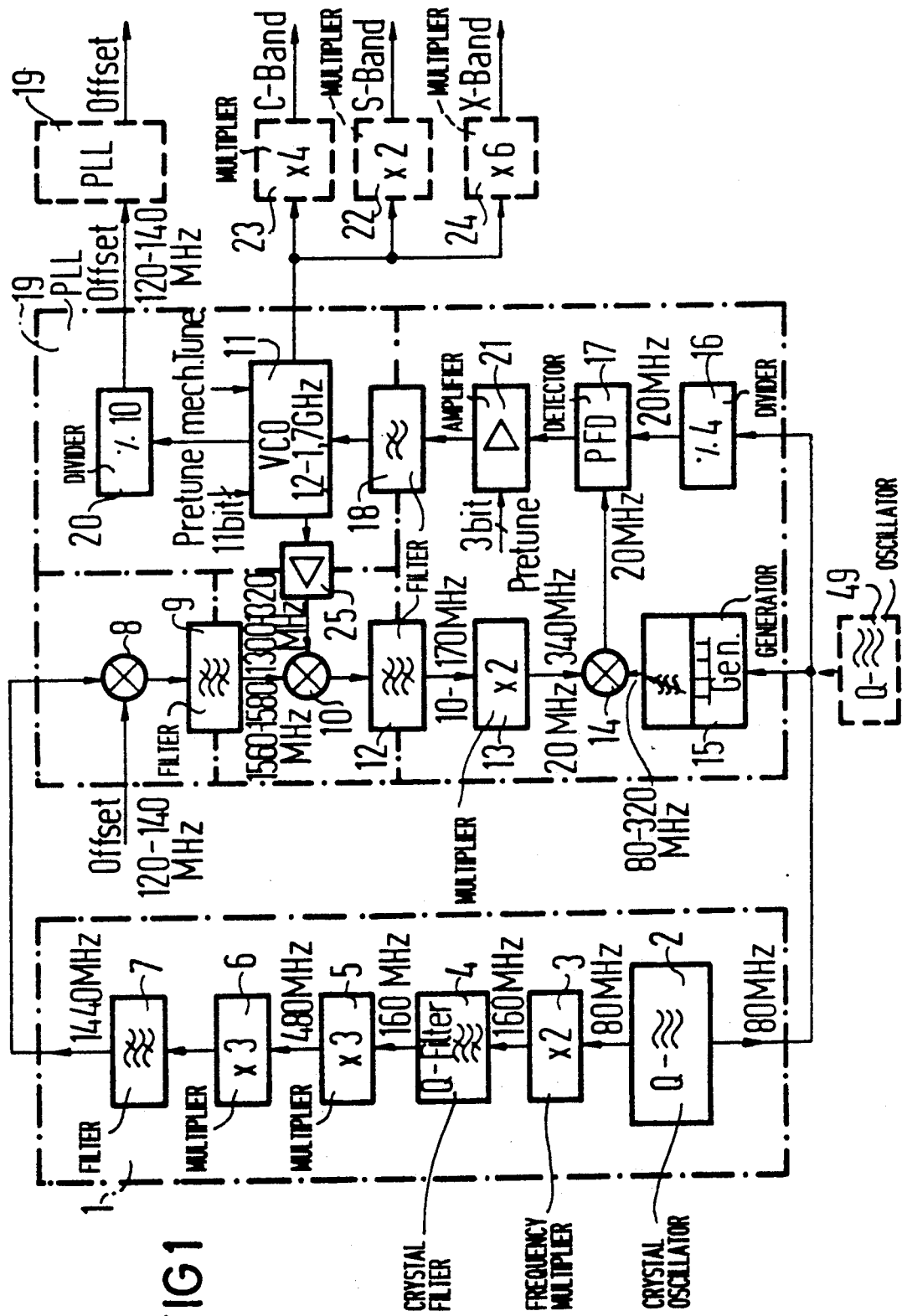
FIG. 1 is a block circuit diagram of an exemplary embodiment of the frequency synthesizer of the present invention.

The clock circuit diagram of an exemplary embodiment of the frequency synthesizer of the present invention shown in FIG. 1 shall be described first. This frequency synthesizer serves the purpose of generating various frequencies in the microwave range. It comprises a reference frequency branch 1 and a plurality of phase-controlled control loops each of which respectively form a PLL (phase locked loop) segment 19 that are cascaded according to the frequency divide and mix principle. The VHF reference signal having the frequency 1440 MHZ is generated in the VHF reference frequency branch 1 proceeding from a high quality crystal oscillator 2 having the frequency 80 MHz. After a frequency doubling of the fundamental frequency of 80 MHz in a frequency multiplier 3, the crystal filter 4 is interposed that further reduces the noise of the oscillator 2. After two further multiplier stages 5 and 6 each of which respectively multiplies by a factor of 3, a narrow-band pass filter 7 insures that the secondary lines are adequately suppressed in the VHF reference signal.

The following PLL segment 19 can be cascaded arbitrarily often according to the known "divide and mix" principle. Thus, in a decadic frequency synthesizer, every PLL segment 19 would realize one decimal place. The offset frequency can be acquired from the preceding PLL control loop by frequency division. In the decadic synthesizer, this requires a frequency divider 20 having the division ratio 1:10. Since both noise as well as the secondary lines of the preceding PLL segment 19 are reduced (factor of $1/N^2$) by the frequency division, a direct digital synthesizer (DDS) can be employed for generating offset frequency instead of employing the derivation via a PLL segment 19.

After the mixing of the VHF reference signal of 1440 MHz with the offset frequency of 120 through 140 MHz in an offset mixing stage 8, the aggregate or different frequency that is filtered out with a band-pass filter 9 is mixed with the output frequency of a voltage-controlled oscillator (VCO) 11 with an intermediate frequency mixer stage 10 in the intermediate frequency level. When the aggregate frequency is filtered in the band-pass filter 9, then 1560 through 1580 MHz are input into the intermediate frequency mixing stage 10 at an input, by contrast whereto this input is supplied with 1300 through 1320 MHz when the difference frequency is filtered out. Which case is more beneficial is dependent on the frequency at which the oscillator VCO 11 is operated. An intermediate frequency filter 12 insures freedom of secondary lines. Even for small frequency increments, spectral lines that would not be harmonic of the reference frequency (synchronous intermediate frequency level) now no longer exist in the intermediate frequency level. It is thereby assured that no secondary lines arise in the digital phase-frequency detector 17 of the PLL segment 19 even for high phase-locked loop bandwidths.

Figure 2:
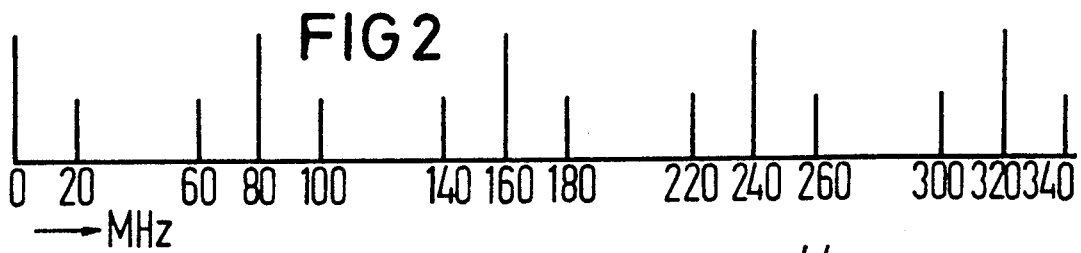
FIG. 2 is a line frequency spectrum of the intermediate frequency as well as of the comb-line spectrum of a screen mixing stage 14 in a PLL 19, as depicted in FIG. 1.

Following the intermediate frequency filtering in the filter 12, the intermediate frequency signal is supplied to a frequency multiplier 13 and is doubled in frequency there. Subsequently, the actual intermediate signal is mixed with a frequency filtered out of the comb-line spectrum, being mixed therewith in a comb mixing stage 14. The line spectrum has a line spacing of 80 MHz and is derived from the fundamental frequency of the crystal oscillator 2 with a comb line generator 15. For intermediate frequencies of 60 MHz, 100 MHz, 140 MHz, 180 MHz, 220 MHz, 260 MHz, 300 MHz, 340 MHz, a combination or beat frequency of 20 MHz thereby arises by mixing with the comb line frequencies 80 MHz, 160 MHz, 240 MHz, 320 MHz. The comb line frequencies and intermediate frequencies are shown as lines in FIG. 2. The combination frequency of 20 MHz contains the center frequency error of the voltage-controlled oscillator VCO 11 and is referred to as an error signal. This error signal is supplied to the phase frequency detector 17. In the phase frequency detector 17, this error signal is compared to a reference signal that is derived from the fundamental frequency of the crystal oscillator 2 by a frequency division with a frequency divider 16 having the division ratio 1:4. The reference frequency signal for the phase frequency detector thus exactly has the frequency of 20 MHz. On the basis of the comparison, a control voltage is generated in the phase frequency detector 17, this control voltage then controlling the voltage-controlled oscillator VCO 11 via a controlled-gain amplifier 21 and via a loop low-pass filter 18. When the intermediate frequency existing after the frequency multiplier 19 is itself 20 MHz, then this is directly supplied to the phase frequency detector 17. The voltage-controlled oscillator VCO 11 can thus engage every 20 MHz. When some other screen that cannot be directly derived from the fundamental frequency of the crystal oscillator 2 is desirable, then a separate crystal-stabilized screen oscillator 49 can be employed that can be potentially synchronized with the crystal oscillator 2. At which of these screen frequencies the voltage-controlled oscillator VCO 11 engages is defined by the pretuning. As a result thereof, the frequency range of the voltage-controlled oscillator VCO 11 can be shifted without hardware modification for the same fundamental crystal frequency, this being a prerequisite for a modular carrier supply concept.

The output frequency of the voltage-controlled oscillator VCO 11 is either divided with a frequency divider 20 (typical division ratios are 8, 10 or 16; the division ratio is 10 in the exemplary embodiment) and is used as offset frequency for the next PLL segment 19 or directly represents the local oscillator frequency. Frequency multipliers 22, 23, 24 can follow for the carrier supply of radar equipment in the higher frequency bands, for example, in the S, C and X band. A high-frequency amplifier 25 is also arranged as an oscillating amplifier by way of supplying the output signal of the voltage-controlled oscillator VCO 11 to the intermediate frequency mixing stage 10.

The switching speed of cascaded phase-locked loops remains extremely high for frequency changes because all phase-locked loops (PLL) work with high reference frequencies or, respectively, loop bandwidths.

The mixing in the comb or screen mixing stage 14 can also be undertaken without preceding frequency doubling in the frequency multiplier 13 when the screen line spacing amounts to 40 MHz. The reference frequency in the phase frequency detector 17 is then 10 MHz. It is also possible to provide a frequency doubling between the screen or comb mixing stage 14 and the phase frequency detector 17.

The controlled-gain amplifier 21 is likewise advantageously set with respect to its gain on the basis of a pretuning.

Figure 3:
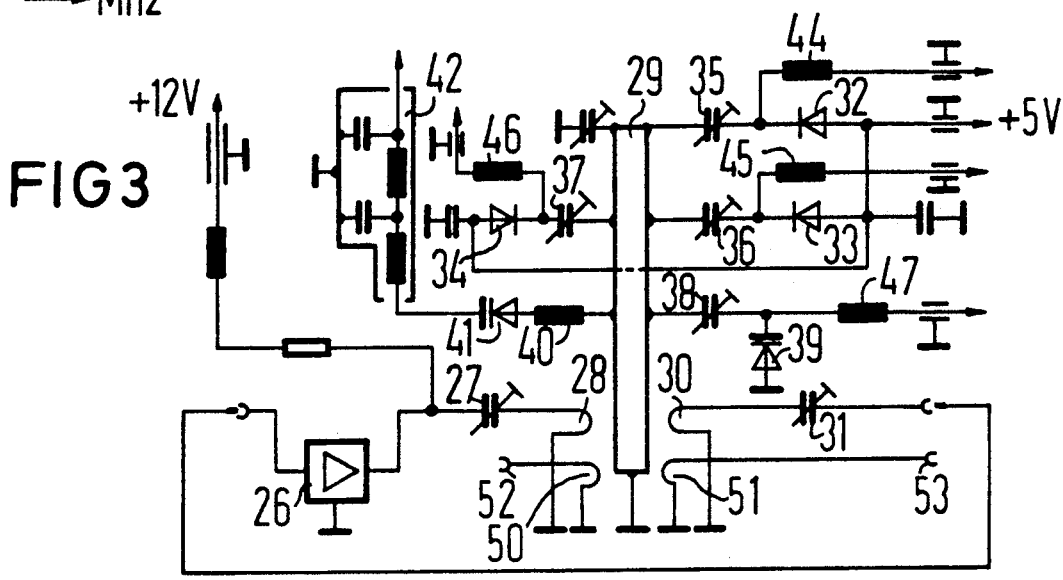
FIG. 3 is a circuit diagram of a voltage-controlled oscillator VCO11 employed in the frequency synthesizer of the present invention.
Figure 4:
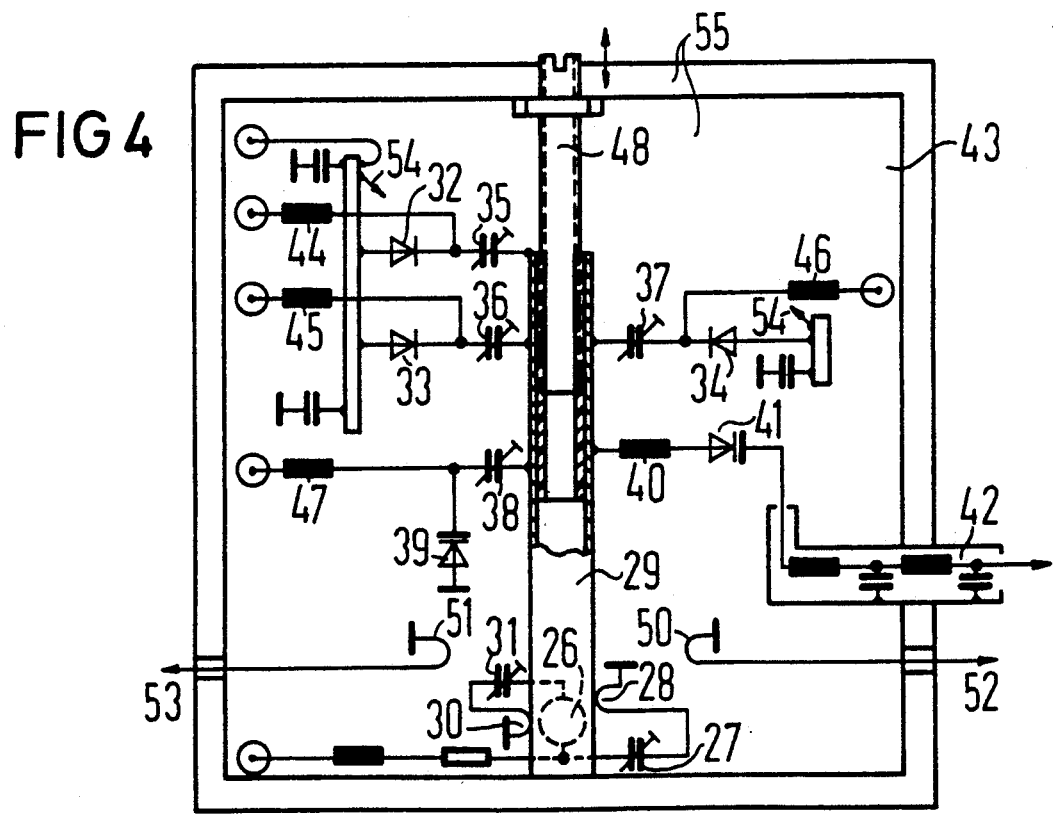
FIG. 4 is a spatial arrangement of this voltage-controlled oscillator as an assembly.

FIG. 3 shows the voltage-controlled oscillator VCO 11 in the form a of a circuit diagram and FIG. 4 shows this oscillator 11 as an assembly 43. The voltage-controlled oscillator is a circuit comprising monolithically integrated high-frequency amplifier (26) in whose co-coupling branch leading from the output thereof to the input thereof and forming a resonant circuit having in series a capacitor 27, a coaxial resonator having an inner conductor 29 and couplable via an inductor in-coupling loop 28 and mechanically tunable with a screw 48, and a further capacitor 31 coupled to the inner conductor 29 via an out-coupling loop 30. A plunger-type capacitor is integrated in the inner conductor 29 and, thus, the frequency of the oscillator can be mechanically tuned with the screw 48. For electronic pretuning, a plurality of trimmer capacitors 35, 36, 37 respectively engageable and disengageable via a PIN diode 32, 33, 34 are connected to the outside wall of the plunger-type capacitor 29 at suitable conditions. The control voltages for the PIN diodes 32, 33, 34 are supplied via inductors 44, 45 and 46. Yet another trimmer capacitor 38 has one end also connected to the outside wall of the inner conductor 29, a first varactor diode 39 that is controlled by pretuning voltage connected to the other end of this trimmer capacitor 38. The control voltage for the first varactor diode 39 is supplied via an inductor 47. Finally, second varactor diode 41 is also connected to the outside wall of the inner conductor 29 via an inductor inductance, this second varactor diode 41 being charged by the control voltage of the phase frequency detector applied via the loop low-pass filter. The loop low-pass filter is executed as a feedthrough filter 42 and is thus integrated into the assembly 43 of the voltage-controlled oscillator. The material of the inner conductor 29 is selected such that the temperature response of the plunger-capacitor, that the inner conductor 29 forms together with the tuning screw 48 secured to a housing 55 forming the outer conductor of the coaxial resonator, compensates the temperature response of the coaxial resonator. Such a compensation can be achieved, for example, when the housing 55 is composed of aluminum and the inner conductor 29 is composed of invar.

Elements 50 and 51 reference two out-coupling loops of the voltage-controlled oscillator assembly 43 that are conducted to outputs 52 or, respectively, 53. The two arrows 54 are intended to indicate a conductive connection via the base plate of the housing 55.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Frequency synthesizer for generating different frequencies in a microwave range, having a reference frequency branch and at least one phase-controlled control circuit that forms a PLL segment and, that for more than one phase-controlled control circuits, are cascaded according to a frequency divide and mix principle, and having an offset mixing stage for mixing a stable offset frequency with a reference frequency derived in the reference frequency branch from a stable crystal oscillator fundamental frequency, having a phase frequency detector for comparing an error signal to a frequency which is likewise derived from the stable fundamental frequency, and having a voltage-controlled oscillator to which an output voltage of the phase frequency detector is supplied via a loop low-pass filter as a control voltage and from which an output frequency as well as, potentially after being conducted through a frequency divider, an offset frequency for the phase-controlled control circuit of a following PLL segment are derived, comprising: following a crystal oscillator that generates the stable fundamental frequency, the reference frequency branch having, in series, a first frequency multiplier, a crystal filter, at least one series-connected further frequency multiplier and a narrow-band band-pass filter dimensioned for the reference frequency; an input of a band-pass filter either for the aggregate or difference frequency connected to an output of the offset mixing stage, the output of said band-pass filter being connected to one of two inputs of an intermediate frequency stage whose other input is supplied with the output frequency of the voltage-controlled oscillator; an output of an intermediate frequency mixing stage, upon interposition of an intermediate frequency filter, directly connected to an input of a screen mixing stage that represents the intermediate frequency input or is connected via a frequency multiplier to said input of said screen mixing stage at whose other input a signal is present that is filtered out of a comb line spectrum having a spectral line spacing corresponding to the fundamental frequency that is derived from the crystal oscillator or that is from a separate crystal oscillator via a comb line generator; the error signal oscillating a synchronous frequency level with the combination frequency of the signals supplied to the screen mixing stage supplied from the output of the screen mixing stage to a first input of the phase frequency detector and a reference signal derived from the crystal oscillator via a frequency divider and thus having a rigid division ratio with respect to the fundamental frequency or, respectively, the screen oscillator frequency supplied to a second input of said phase frequency detector for comparison; and the voltage-controlled oscillator to which the output voltage of the phase frequency detector, deriving as a result of the comparison supplied as the control voltage via the loop low-pass filter, being pretunable such that those frequencies of the comb line frequencies which the screen mixing stage respectively engages can be preset.

2. Frequency synthesizer according to claim 1, wherein the offset frequency is generated by a direct digital synthesizer instead of being generated by way of derivation via a PLL segment.

3. Frequency synthesizer according to claim 1, wherein said frequency synthesizer has a plurality of PLL segments and wherein all PLL segments are identically constructed.

4. Frequency synthesizer according to claim 1, wherein the division ratio of the frequency dividers amounts to 1:10 for the phase-controlled control circuits cascaded in conformity with the frequency divide and mix principle, so that a decadic frequency synthesizer derives in which each PLL segment realizes one decimal place.

5. Frequency synthesizer according to claim 1, wherein the loop low-pass filter is preceded by a control-gain amplifier whose gain is pretunable.

6. Frequency synthesizer according to claim 1, wherein the intermediate frequency signal, when it coincides with the error signal in terms of frequency, is directly conducted to the first input of the phase frequency detector, that is without being introduced to the intermediate frequency input of the screen mixing stage.

7. Frequency synthesizer according to claim 1, wherein the output signal of the voltage-controlled oscillator is respectively connected to one or more frequency multipliers that are arranged parallel to one another, so that carrier frequencies in higher frequency bands can be generated.

8. Frequency synthesizer according to claim 1, wherein the first frequency multiplier in the reference frequency branch is a frequency doubler.

9. Frequency synthesizer according to claim 1, wherein two further frequency multipliers each of which is a frequency tripler is provided in the reference frequency branch following the crystal filter.

10. Frequency synthesizer according to claim 1 a high-frequency amplifier is also connected as an isolating amplifier in the path of the supply of the output signal of the voltage-controlled oscillator to the intermediate frequency mixing stage.

11. Frequency synthesizer according to claim 1, wherein the voltage-controlled oscillator is a circuit comprising a series connection of a monolithically integrated high-frequency amplifier, a first capacitor, a coaxial resonator having an inner conductor that is coupled via an inductive in-coupling loop and is mechanically tunable, and a second capacitor coupled to the inner conductor via an out-coupling loop in the co-coupling branch of said circuit that forms a resonant circuit and connects from the output thereof to the input thereof; for electronic pretuning, a plurality of trimmer capacitors respectively engageable and disengageable via PIN diodes, respectively connected at an outside to the inner conductor at suitable positions; another trimmer capacitor also having its one end connected at the outside to the inner conductor, a first varactor diode controlled by a pretuning voltage connected to the other end of said trimmer capacitor; and a second varactor diode that is charged by the control voltage also connected at the outside to the inner conductor via an inductor inductance.

12. Frequency synthesizer according to claim 11, wherein mechanical tuning of the coaxial resonator ensues with a tuning screw that is secured to a housing forming the outer conductor of the coaxial resonator and with which screw a plunger-type capacitor integrated with the inner conductor is set with respect to its capacitance.

13. Frequency synthesizer according to claim 11, wherein the loop low-pass filter, as a feedthrough filter, is part of the voltage-controlled oscillator.

14. Frequency synthesizer according to claim 11, wherein the inner conductor forming the plunger-type capacitor together with the tuning screw are temperature-compensating, for example, by being executed of invar.

15. Frequency synthesizer according to claim 1, wherein the frequency synthesizer is used in a frequency-agile radar means.

16. Frequency synthesizer for generating different frequencies in a microwave range, having a reference frequency branch and at least one phase-controlled control circuit that forms a PLL segment and, that for more than one phase-controlled control circuits, are cascaded according to a frequency divide and mix principle, and having an offset mixing stage for mixing a stable offset frequency with a reference frequency derived in the reference frequency branch from a stable crystal oscillator fundamental frequency, having a phase frequency detector for comparing an error signal to a frequency which is likewise derived from the stable fundamental frequency, and having a voltage-controlled oscillator to which an output voltage of the phase frequency detector is supplied via a loop low-pass filter as a control voltage and from which an output frequency as well as, potentially after being conducted through a frequency divider, an offset frequency for the phase-controlled control circuit of a following PLL segment are derived, comprising: following a crystal oscillator that generates the stable fundamental frequency, the reference frequency branch having, in series, a first frequency multiplier, a crystal filter, at least one series-connected further frequency multiplier and a narrow-band band-pass filter dimensioned for the reference frequency; an the input of a band-pass filter either for the aggregate or difference frequency connected to an output of the offset mixing stage, the output of said band-pass filter being connected to one of two inputs of an intermediate frequency stage whose other input is supplied with the output frequency of the voltage-controlled oscillator; an output of an intermediate frequency mixing stage, upon interposition of an intermediate frequency filter, directly connected to an input of a screen mixing stage that represents the intermediate frequency input or is connected via a frequency multiplier to said input of said screen mixing stage at whose other input a signal is present that is filtered out of a comb line spectrum having a spectral line spacing corresponding to the fundamental frequency that is derived from the crystal oscillator or that is from a separate crystal oscillator via a comb line generator; the error signal oscillating a synchronous frequency level with the combination frequency of the signals supplied to the screen mixing stage supplied from the output of the screen mixing stage to a first input of the phase frequency detector and a reference signal derived from the crystal oscillator via a frequency divider and thus having a rigid division ratio with respect to the fundamental frequency or, respectively, the screen oscillator frequency supplied to a second input of said phase frequency detector for comparison; and the voltage-controlled oscillator to which the output voltage of the phase frequency detector, deriving as a result of the comparison supplied as the control voltage via the loop low-pass filter, being pretunable such that those frequencies of the comb line frequencies which the screen mixing stage respectively engages can be preset; the voltage-controlled oscillator having a series connection of a monolithically integrated high-frequency amplifier, a first capacitor, a coaxial resonator having an inner conductor that is coupled via an inductive in-coupling loop and fashioned mechanically tunable, and a second capacitor coupled to the inner conductor via an out-coupling loop in the co-coupling branch of said circuit that forms a resonant circuit and connects from the output thereof to the input thereof; for electronic pre-tuning, a plurality of trimmer capacitors respectively engageable and disengageable via PIN diodes, respectively connected at an outside to the inner conductor at suitable positions; another trimmer capacitor also having its one end connected at the outside to the inner conductor, a first varactor diode controlled by a pretuning voltage connected to the other end of said trimmer capacitor; and a second varactor diode that is charged by the control voltage also connected at the outside to the inner conductor via an inductor inductance.

17. Frequency synthesizer according to claim 16, wherein mechanical tuning of the coaxial resonator ensues with a tuning screw that is secured to a housing forming the outer conductor of the coaxial resonator and with which screw a plunger-type capacitor integrated with the inner conductor is set with respect to its capacitance.

18. Frequency synthesizer according to claim 16, wherein the loop low-pass filter, as a feedthrough filter, is part of the voltage-controlled oscillator.

19. Frequency synthesizer according to claim 16, wherein the inner conductor forming the plunger-type capacitor together with the tuning screw are temperature-compensating, for example, by being executed of invar.

* * * * *